(12) United States Patent
Han et al.

(10) Patent No.: US 11,751,414 B2
(45) Date of Patent: Sep. 5, 2023

(54) DISPLAY DEVICE

(71) Applicant: LG DISPLAY CO., LTD., Seoul (KR)

(72) Inventors: Hong-Gyu Han, Paju-si (KR);
Byung-Jun Lim, Paju-si (KR);
Hwa-Jun Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 427 days.

(21) Appl. No.: 17/123,783

(22) Filed: Dec. 16, 2020

(65) Prior Publication Data

US 2021/0202887 A1 Jul. 1, 2021

(30) Foreign Application Priority Data

Dec. 31, 2019 (KR) .................. 10-2019-0178892

(51) Int. Cl.
*H10K 59/131* (2023.01)
*H10K 50/818* (2023.01)
*H10K 50/824* (2023.01)
*H10K 50/80* (2023.01)

(52) U.S. Cl.
CPC ......... *H10K 50/818* (2023.02); *H10K 50/824* (2023.02); *H10K 50/868* (2023.02); *H10K 59/131* (2023.02)

(58) Field of Classification Search
CPC .......... H10K 50/86–865; H10K 59/131–1315; H10K 59/8791–8792
See application file for complete search history.

(56) References Cited

U.S. PATENT DOCUMENTS 6,483,560 B2 11/2002 Iida et al.
2019/0312097 A1* 10/2019 Choi .................. H01L 27/1248

FOREIGN PATENT DOCUMENTS

KR 19980024694 A 7/1998

OTHER PUBLICATIONS

Notice of Reasons for Refusal issued by the Japanese Patent Office in corresponding JP Application No. 2020-2135152, dated Nov. 18, 2021.

* cited by examiner

*Primary Examiner* — Daniel P Shook
(74) *Attorney, Agent, or Firm* — Morgan, Lewis & Bockius LLP

(57) ABSTRACT

An display device may include a substrate including an active area and an inactive area surrounding the active area, a plurality of thin film transistors disposed in the active area, each of the thin film transistor including a semiconductor layer and a first electrode, a light emitting elements disposed in the active area, each of the light emitting element including an anode electrode and an organic light emitting layer, a connection area and a peripheral area disposed in the inactive area, and a first reflective electrode disposed in the connection area.

16 Claims, 9 Drawing Sheets

DISPLAY DEVICE

CROSS-REFERENCE TO RELATED APPLICATION

This application claims priority to and the benefit of Korean Patent Application No. 10-2019-0178892, filed on Dec. 31, 2019, the disclosure of which is incorporated herein by reference in its entirety.

BACKGROUND

Technical Field

This invention relates to a display device, and more particular to the display device including a display panel having a rounded corner.

Discussion of the Related Art

Recently, as society enters information society, the display that visually expresses electrical information signals has developed rapidly. Further, in response to this, various display devices with excellent performance of thinner, lighter, and low power consumption has been developed.

For example, the display device includes a LCD (Liquid Crystal Display device), an OLED (Organic Light Emitting Display device), and a quantum dot display device.

Among these display devices, the self-light emitting display device such as OLED is considered as a competitive application for compactness and clear color display of the device without requiring a separate light source. The display device includes a self-light emitting element in each subpixel. The self-light emitting element includes two electrodes facing each other and a light emitting layer disposed between the two electrodes to emit the light when transported electrons and holes are recombined. In addition, the display device may include a display panel and a plurality of components for providing various functions. For example, one or more display driving circuits for controlling the display panel may be included in the display device.

Examples of driving circuits may include gate drivers, light emitting (source) drivers, high potential voltage line (VDD), low potential voltage line (VSS), electrostatic discharge (ESD) circuits, multiplex (MUX) circuits, data signal lines, cathode contacts, and other functional elements. Further, a plurality of peripheral circuits for providing various kinds of additional functions, for example, touch sensing or fingerprint identification functions, may be included in the display device. Some components may be disposed on the display panel itself, or may be disposed on a film or circuit board disposed outside the display panel.

The components such as the gate drivers, the high-potential voltage lines, the low-potential voltage lines, and the ESD may be disposed on the display panel. These components are usually disposed in the inactive area IA, which is disposed in the left and right portions or upper and lower portions outside an active area.

The display devices for a mobile electronics may have rounded corners for a sense of grip, durability, and aesthetics. If the product has a rounded corner, the product can withstand the impact better than the product having rectangular corner when the product falls, and it can be held more gently in the hand. Further, the active area can be maximized in the screen to maximize the sense of immersion and aesthetics.

However, in the display device having a rounded corner, the external light is reflected in the corner region. That is, the light is reflected at the inactive area near the corner or outer portion of the active area. Due to this reflected light, there is a problem in that the image is weakened or the viewing of the user is disturbed in the active area near the rounded corner.

Thus, it is necessary to reduce the reflected light to improve user immersion.

SUMMARY

Accordingly, embodiments of the present disclosure are directed to a display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, A display device may comprise a substrate including an active area and an inactive area surrounding the active area, a plurality of thin film transistor disposed in the active area, each of the thin film transistor including a semiconductor layer and a first electrode, a light emitting elements disposed in the active area, each of the light emitting element including an anode electrode and an organic light emitting layer, a connection area and a peripheral area disposed in the inactive area, and a first reflective electrode disposed in the connection area.

In another aspect, a display device may comprise a substrate including an active area and an inactive area surrounding the active area, a plurality of thin film transistor disposed in the active area, each of the thin film transistor including source/drain electrodes, a light emitting elements disposed in the active area, each of the light emitting element including an anode electrode, an organic light emitting layer, and a cathode electrode, a connection area and a peripheral area disposed in the inactive area, and a first reflective electrode disposed in the connection area.

In accordance with embodiments of the present disclosure, a plurality of line structures for driving the organic light emitting element may be disposed in the corner of the active region. Gate signals or initialization signals of a gate driver disposed in the inactive region may be connected to the organic light emitting element through lines disposed in the corner connection area.

These lines are mainly connected 1:1 with the organic light emitting element or connected in a column unit of the organic light emitting element, so that a very complex structure may be disposed in the connection area. Such complicated line structures may cause diffuse reflection of external light incident through the upper polarizing film. The diffusely reflected external light may pass through the upper polarizing film again, and a bright portion may enter the user's eye.

When external light is vertically reflected from the anode electrode or the peripheral electrode in the active region, the reflective light may be blocked by the polarizing film. However, since the light reflected from the connection area is not a vertical reflection but a diagonal diffuse reflection, the reflected light may pass through the polarizing film. The diffuse reflection may occur in the connection area of the corner or the peripheral area adjacent to the lower pad in the active area.

The common point of these areas may be that the lines disposed in the complex structure and the electrodes having good reflectivity such as separate anode electrode or peripheral electrode are not disposed. Since the diffuse reflection of the external light caused by these lines and electrodes passes through the polarizing film and enters the user's eye. Thus, the degree of immersion of the screen corresponding to the active area may be reduced.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
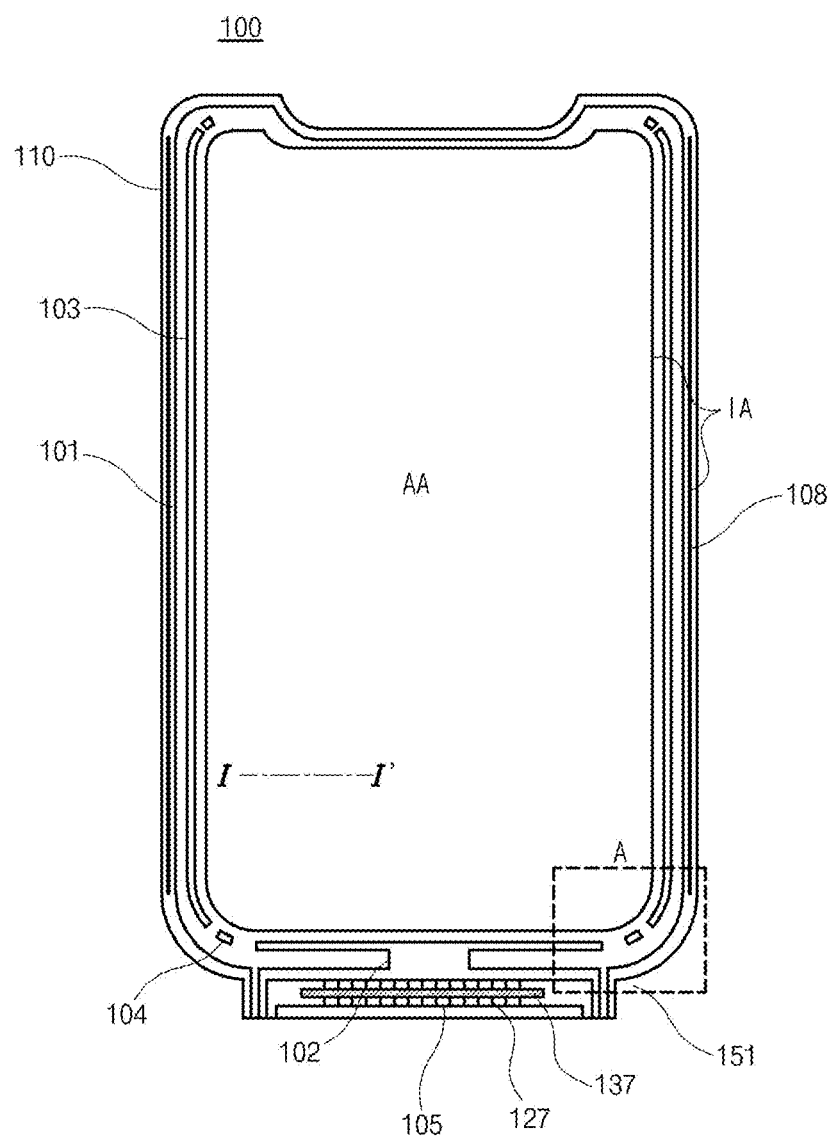
FIG. 1 is a plan view illustrating the entire display device.

Advantages and technical features of the present disclosure, and methods for achieving the advantages and the technical features will be clarified with reference to embodiments described below in detail together with the accompanying drawings. However, the present disclosure is not limited to the embodiments disclosed below, but will be implemented in various different forms. The embodiments allow the disclosure of the present disclosure to be complete and the ordinary skilled in the art to fully understand. The present disclosure is only defined by the scope of the claims.

The shapes, sizes, ratios, angles, numbers, etc., disclosed in the drawings for describing the embodiments of the present invention are exemplary, and the present invention is not limited to the drawings. The same reference numerals refer to the same components throughout the specification. In addition, in the description of the present disclosure, when it is determined that detailed descriptions of related known technologies may unnecessarily obscure the subject matter of the present disclosure, detailed descriptions thereof will be omitted. When 'include', 'have', 'consist of', etc., are used in this specification, other parts may be added unless 'only' is used. When a component is expressed as a singular number, the plural number is included unless otherwise specified.

In interpreting the components, it is interpreted as including the error range even if there is no explicit description.

In the case of the description of the positional relationship, for example, when the positional relationship of two parts is described as 'on', 'over', 'under', 'at a side', etc., one or more other parts may be positioned between the two parts unless 'right' or 'direct' is used.

In the case of the description of the temporal relationship, for example, when the temporal order relationship is described as 'after', 'continually', 'next', 'before', etc., discontinuous cases may be included unless 'right' or 'direct' is used.

Terms 'first', 'second', etc., are used to describe various components, but these components are not limited by these terms. These terms are only used to distinguish one component from another component. Accordingly, the first component mentioned below may be the second component within the technical spirit of the present disclosure.

In describing the components of the present disclosure, terms of 'first', 'second', 'A', 'B', '(a)', '(b)', etc. may be used. These terms are only used to distinguish the component from other components, and the nature, turn, order, or number of the component is not limited by the terms. When a component is described as being "connected", "combined" or "contacted" to another component, the component is directly connected or contacted to the another component, but it is to be understood that another component may be "interposed" between the components or the components may be "connected", "combined" or "contacted" through another component.

In the present disclosure, a "display apparatus" may include a narrow-sense display device including a display panel and a driving portion for driving the display panel such as a liquid crystal display module (LCM), an organic light-emitting display module (OLED module), and a quantum dot module (QD module). In addition, the display apparatus may include a complete product or final product including an LCM, an OLED module or a QD module such as a notebook computer, a television, a computer monitor, an equipment display including an automotive display apparatus or a different type display apparatus of vehicle, a set electronic device such as a mobile electronic device apparatus of a smartphone or an electronic pad, or a set device or set apparatus.

Accordingly, the display apparatus of the present disclosure may include a narrow-sense display device itself such as an LCM, an OLED module or a QD module and an applied product or a set device that is a final consumer device including an LCM, an OLED module or a QD module.

Additionally, in some cases, an LCM, an OLED module or a QD module composed of a display panel and a driving portion may be expressed as a narrow-sense "display device", and an electronic device as a complete product including an LCM, an OLED module or a QD module may be separately expressed as "a set device." For example, the narrow-sense display device may include a display panel such as a LC panel, an OLED panel or a QD panel and a source PCB that is a control unit for driving the display panel, and the set device may be a concept that further includes a set PCB, which is a set control unit electrically connected to the source PCB to control the entire set device.

The display panel used in the embodiment of the present disclosure may include all types of display panels such as a liquid crystal display panel, an organic light-emitting diode display panel, a quantum dot display panel, or an electroluminescent display panel and is not limited to a specific display panel capable of bending a bezel with a flexible substrate for an OLED display panel of the present embodiment and a backplane support structure thereunder. In addition, the display panel used in the embodiment of the present disclosure is not limited to the shape or size of the display panel.

For example, when the display panel is an OLED display panel, it may include a plurality of gate lines and data lines and pixels formed at crossing areas of the gate lines and the data lines. In addition, it may be configured to include an array including a thin film transistor which is an element for selectively applying a voltage to each pixel, an organic light-emitting device (OLED) layer on the array, an encapsulation substrate or encapsulation layer over the array to cover the organic light-emitting device layer, and so on. The encapsulation layer may protect the thin film transistor and the organic light-emitting device layer from the external impacts and prevent moisture or oxygen from penetrating into the organic light-emitting device layer. Further, an inorganic light-emitting layer formed on the array may include a nano-sized material layer or a quantum dot, for example.

In the invention, FIG. 1 illustrates an exemplary organic light emitting display (OLED) panel 100 that may be incorporated into display devices.

FIG. 1 is a plan view of the display panel according to an embodiment of the invention. At this time, FIG. 1 illustrates the exemplarily organic light emitting display (OLED) panel 100 that can be incorporated into the display devices. Referring to FIG. 1, the organic light emitting display panel 100 includes at least one active area AA in which light emitting devices and an array for driving the light emitting devices are formed.

The display panel 100 may include an inactive area IA disposed at the periphery of the active area AA. The inactive area IA may be formed at the top, bottom, left and right portions of the active area AA. The active area AA may be formed in a rectangular shape. Further, the active area AA may be formed in various shapes such as a circle, an ellipse, or a polygon when the display device is adapted to a smart watch or an automobile. Accordingly, the arrangement of the inactive area IA surrounding the active area AA is not limited to the organic light emitting display panel 100 illustrated in FIG. 1.

In the inactive area IA in the left and right portion of the active area AA, various components for driving the light emitting elements and the arrays in the active area AA are disposed to provide the function for stable emitting the light. For example, these components may include circuits such as the gate driver (Gate-in-Panel), the multiplexer, and the electrostatic discharge circuits 104, a contacting portion for contacting the cathode that is a part of the light emitting element and the low potential voltage line 101 that is a voltage reference of the light emitting element, and a plurality of dams for preventing overflow of an encapsulation layer for protecting the light emitting element from a moisture or impurities during the deposition process of an impurities compensation layer.

Further, a crack stopper structure for preventing the propagation of cracks that may occur during a cutting process (scribing process) for dividing the mother substrate into individual display panels 100 may be disposed in the inactive area IA.

When the substrate 110 is trimming, that is, cutting, the heat and stress may be generated at the trimming surface of the substrate 110. An impact caused by the heat and the stress may generate crack. The crack may be transferred to the inactive area IA so that the gate driver, the ESD 104, or the low potential voltage line 101 disposed in the inactive area IA may be damaged.

Further, the crack may be path of moisture and oxygen from the outside, so that the moisture and the oxygen may be penetrated to the inactive area IA. The moisture and the oxygen causes blank regions in an organic light emitting layer of the organic light emitting display (OLED) panel 100 so that dark spots may be grown or pixel may be shrank by the blank regions.

The crack stopper structure 108 of the invention may block the propagation of the crack to the inactive area IA, so that the damage of the gate driver, the ESD 104, or the low potential voltage line 101 and the penetration of the moisture and the oxygen may be prevented.

The crack stopper structure 108 may be formed of an inorganic layer or an organic layer. Further, the crack stopper structure 108 may be formed of a plurality of inorganic layers or a plurality of organic layers. However, the crack stopper structure 108 is not limited to these layers. As shown in FIG. 1, the crack stopper structure 108 is disposed only in both sides of the long side and one side of the short side of the display panel 100, but is not limited thereto. For example, the crack stopper structure 108 may also be disposed in the bending area and the notched area, that is, the crack stopper structure 108 may be disposed in all peripheries of the substrate 110.

When the active area AA is formed, the insulating layer (e.g., gate insulating layer and buffer layer etc.) may be completely or partially etched in the portion near a cutting surface of the substrate at the outer portion of the crack stopper structure 108. By the etching, small amount of the insulating layer is left on the upper portion of the substrate 110 or the upper surface of the substrate is completely exposed, so that a cutting impact may not be transferred to the corresponding insulating layer.

Referring to FIG. 1, a FPCB may be disposed in the lower portion of the display panel 100. The FPCB is electrically connected to a pad for receiving a data signal and for exchanging a touch signal to the external power. Further, in the lower portion of the display panel 100, the high potential voltage line 102, the low potential voltage line 101, and/or the data voltage lines 127, which are extended from the FPCB, may be disposed.

In the invention, the data voltage line 127 is disposed to be connected to the data driver 137 for generating a light emitting signal of the light emitting element.

Referring to FIG. 1, in the display panel 100 of the invention, both corners at the upper portion of the display panel may be cut to form a notch 151 for bending the bending area of the display panel 100.

For example, when a mother substrate is cut to divide the mother substrate into the individual display panel, the display panel 100 may be cut into the inside of the inactive area IA near both lower corner areas of the display panel 100 which is a part of the inactive area IA, so that the notch 151 may be formed such that the cut surface is adjacent to the high potential voltage line 102 or the low potential voltage line 101.

The notch 151 of the invention may be started at one end of the flexible substrate 110 and the flexible substrate 110 may be bent in the portion near this area. The bending is ended at the portion near the data driver 137 to fold the portion having the data driver 137 and the FPCB pad 105 into the rear surface of the active area AA. FIG. 1 illustrates the display panel 100 in which the substrate is bent using the notch 151, but is not limited thereto, and the notch 151 may not be formed or the substrate may not be bent.

The member connected to the pad 105 formed on the upper surface of the display panel 100 is not limited to the FPCB, and various members may be connected, and the pad 105 may be disposed on the upper surface or the rear surface of the display panel 100.

In FIG. 1, the data driver 137 is illustrated as being disposed on the upper surface of the display panel 100, but is not limited to the data driver 137, and other driver may be disposed on the upper surface of the display panel 100. Further, the location of the data driver 137 is not limited to the upper surface of the display panel 100, and the data driver 137 may be disposed at the rear surface of the display panel 100.

Figure 2:
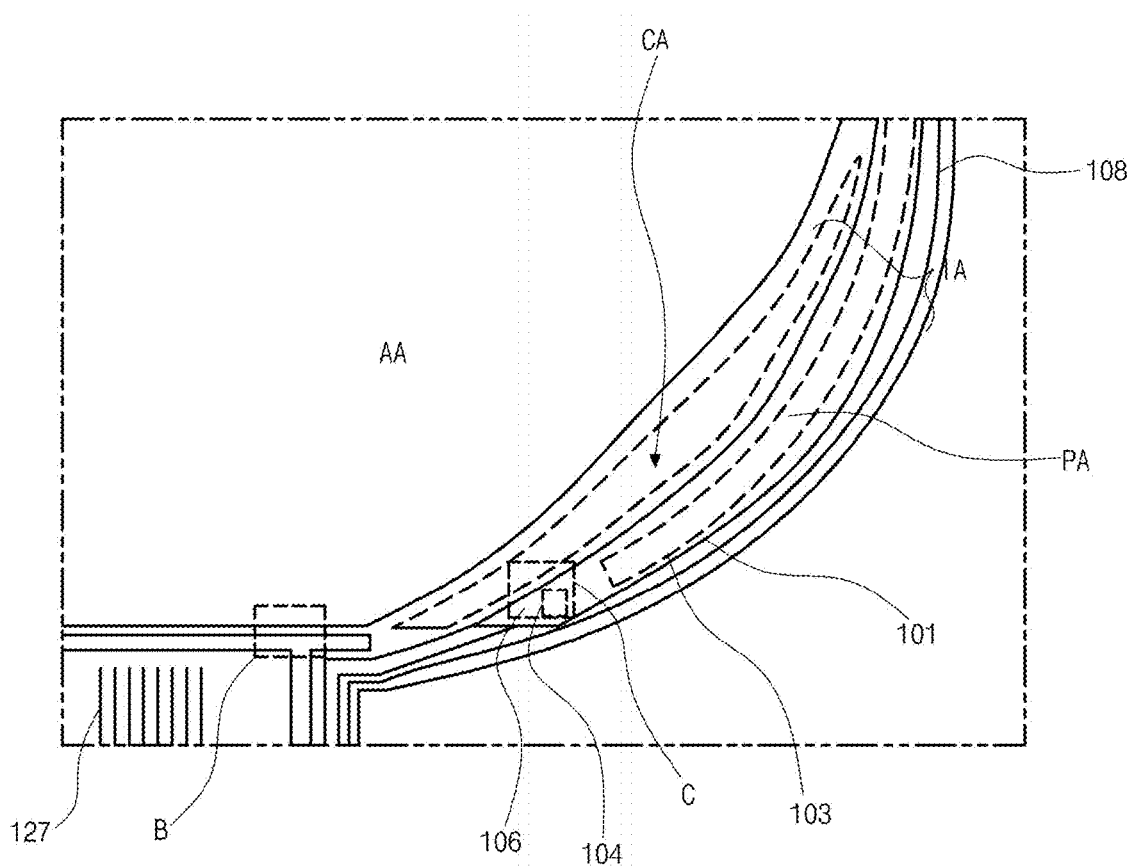
FIG. 2 is an enlarged plan view of area A of FIG. 1.

FIG. 2 is an enlarged view of area A of FIG. 1.

Referring to FIG. 2, in the inactive area IA of the display panel 100, the power for driving each sub-pixel and various signals may be supplied from the outside. For example, the high potential voltage line 102 and the low potential voltage line 101 may be disposed in the inactive area IA. Further, the gate driver 103, the ESD 104, and the data voltage line 127 may be respectively disposed in the inactive area IA. The peripheral electrode 106 may be disposed to cover a part of the gate driver 103, the ESD 104, and the low potential voltage line 101. The high potential voltage line 102 may be extended to the active area AA from the end portion of the display panel 100 and the low potential voltage line 101 may be extended to the portion near the inactive area IA from the side of the high potential voltage line 102.

A connection area CA, through which the lines pass, may be formed in the portion between the peripheral electrode 106 in the peripheral area PA of the inactive area IA and the active area AA. The connection area CA may be disposed at the top, bottom, left, and right corners of the display panel 100. The connection area CA may be disposed at the corner where the active area AA is circularly curved. The reason why the connection area CA is disposed is that the outline of the substrate 110 and the outline of the active area AA cannot be exactly matched. Since the corner of the active area AA is closer to a circular shape than the corner of the substrate due to the design of the display panel 100, for example, an empty space in which the components are not disposed may occur.

In the left and right peripheries of the display panel 100 that occupies most of the space in which the components are disposed, the gate driver 103 or the low potential voltage line 101 may be designed to be apart from the end of the substrate 110 at the predetermined distance. Further, the stopper structure 108 may be disposed to surround the peripheral area PA of the inactive area IA at the predetermined distance from the end of the substrate 110.

In order to connect the gate driver 103 and the low potential voltage line 101, the gate driver 103 or the low potential voltage line 101 may be designed to be disposed at the certain distance from the outer edge of the substrate 110 in the corner of the display panel 100. This is because the electrical characteristics of the gate driver 103 and the connection structure of the low potential voltage line 101 for grounding the elements arranged in the active area AA should be considered. Thus, the connection areas CA in which components are not disposed may be disposed at both lower corners of the active area AA or four corners of the active area AA.

Figure 3:
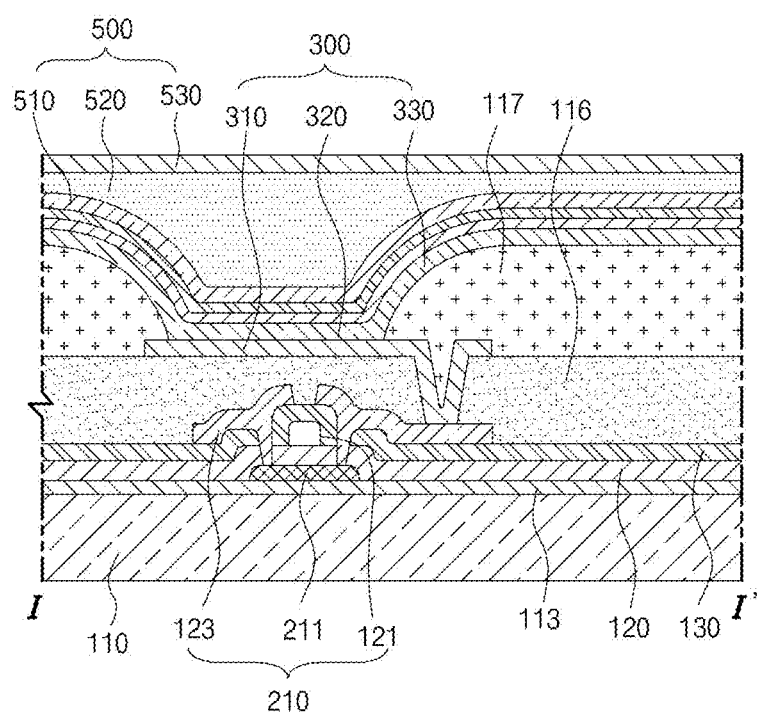
FIG. 3 is a cross sectional view illustrating structure of a light emitting element in the active area.

FIG. 3 is a sectional view along the cutting line I-I' of FIG. 1. A thin film transistor is disposed in the active area AA of the substrate 110 and a display element is connected electrically to the thin film transistor. In FIG. 3, the organic light emitting display element is used as the display element. Hereinafter, the display panel 100 having the organic light emitting element will be described.

The electric connection of the organic light emitting element to the thin film transistor 210 means the electric connection of an anode electrode 310 of the organic light emitting element to the thin film transistor 210. The thin film transistor 210 may be also disposed in the inactive area IA disposed at the peripheral portion of the substrate 110. For example, the thin film transistor 210 in the inactive area IA may be a part of the circuit unit for controlling the electric signal applied to the active area AA.

The thin film transistor 210 includes a semiconductor layer 211 made of an amorphous silicon, a crystalline silicon, and an organic semiconductor material, a gate electrode 121, and source/drain electrodes 123. A buffer layer 113 made of a silicon oxide, a silicon nitride, or a silicon oxy-nitride is disposed on the substrate 110 to planarize the surface of the substrate 110 or prevent the impurities to the semiconductor layer 211. The semiconductor layer 211 may be disposed on the buffer layer 113.

The gate electrode 121 may be disposed over the semiconductor layer 211. The gate electrode 121 is formed in consideration of adhesion to adjacent layers, surface flatness of the layer to be laminated. For example, the gate electrode 121 may be formed in a single layer or multiple layers made of one or more material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W)), and copper (Cu).

A gate insulating layer 120 made of an insulating material such as silicon oxide, silicon nitride, or silicon oxy-nitride is formed between the semiconductor layer 211 and the gate electrode 121 to insulate the semiconductor layer 211 and the gate electrode 121. An interlayer 130 may be disposed on the gate electrode 121. The interlayer 130 may be formed a single layer or multi layers made of material such as silicon oxide, silicon nitride, or silicon oxy-nitride The source/drain electrodes 123 are disposed over the interlayer 130. The source/drain electrodes 123 are electrically connected to the semiconductor layer 211 through a contact hole formed in the interlayer 130 and the gate insulating layer 120.

The source/drain electrodes 123 are formed in consideration of conductivity. For example, the source/drain electrodes 123 may be formed in a single layer or multiple layers made of one or more material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W)), and copper (Cu).

A passivation layer (not shown in figure) may be disposed to cover the thin film transistor in order to protect the thin film transistor. For example, the passivation layer may be made of silicon oxide, silicon nitride, or silicon oxy-nitride. The passivation layer may be formed in a single layer or multi layers.

A planarization layer 116 may be disposed over the passivation layer. As shown in FIG. 3, for example, the planarization layer 116 may serve to substantially planarize the upper portion of the passivation layer covering the thin film transistor 210 in case where the organic light emitting element 300 is disposed at the upper portion of the thin film transistor.

For example, the planarization layer 116 may be made of general purpose polymer such as Polymethylmethacrylate (PMMA) or Polystyrene (PS), polymer derivatives with phenol based groups, acryl based polymer, imide based polymer, aryl ether based polymer, amide based polymers, fluorine based polymer, p-xylene based polymer, vinyl alcohol based polymer, and organic including blends thereof, but are not limited thereto.

Further, although the planarization layer 116 is illustrated as the single layer in FIG. 3, various modifications are possible, such as multi layers. The display panel 100 according to the embodiment of the invention may have both the passivation layer and the planarization layer 116 or may have only the planarization layer 116 if necessary. The planarization layer 116 may be referred to as a first insulating layer.

In the active area AA of the substrate 110, the organic light emitting element 300 including an anode electrode 310, a cathode electrode 330, and the organic light emitting layer 320 formed therebetween is disposed over the planarization layer 116.

An opening for exposing the at least one of the source/drain electrodes 123 of the thin film transistor 210 is formed in the planarization layer 116 to connect electrically the anode electrode to at least one of the source/drain electrodes 123, thereby the anode electrode 310 is electrically connected to the thin film transistor 210. The anode electrode 310 may be a (half) transparent electrode or a reflective electrode.

When the anode electrode 310 is the (half) transparent electrode, for example, the anode electrode 310 may be made of ITO, IZO, ZnO, $In_2O_3$, IGO, or AZO. When the anode electrode 310 is the reflective electrode, the anode electrode 310 may include a reflective layer made of Ag, Mg, Al, Pt, Pd, Au, Ni, Nd, Ir, Cr, and compound thereof and a layer made of ITO, IZO, ZnO, $In_2O_3$, IGO or AZO. However, the anode electrode 310 of the invention is not limited thereto, and the anode electrode 310 may include various materials, and its structure may also be modified in various ways, such as a single layer or a multi layers. In this embodiment, although the reference number 310 is described as the anode electrode, it may be referred to as a pixel electrode and a first electrode.

A bank layer 117 may be disposed over the planarization layer 116. The bank layer 117 defines a pixel by having an opening corresponding to each sub pixel, that is, the opening through which at least the central portion of the anode electrode 310 is exposed. As shown in FIG. 3, further, the bank layer 117 increases the distance between the edge of the anode electrode 310 and the cathode electrode 330 above the anode electrode 310 to prevent arcs at the edge of the anode electrode 310. For example, the bank layer 117 may be formed of the organic material such as polyimide or hexamethyldisiloxane (HMDSO). The bank layer 117 may be referred to as a second insulating layer or a pixel defining layer.

An intermediate layer of the organic light emitting layer 320 may include a low molecular weight or high molecular weight material. If intermediate layer includes the low molecular weight material, a hole injection layer (HIL), a hole transport layer (HTL), an emitting layer (EML), an electron transport layer (ETL), an electron injection layer (EIL), etc. may be stacked in a single or complex structure. The intermediate layer of the organic light emitting layer 320 may be made of the organic material such as copper phthalocyanine (CuPc), N,N-di(naphthalen-1-yl)-N, N'-di-Phenyl-benzidine (N,N'-Di(naphthalene-1-yl)-N, N'-diphenyl-benzidine (NPB), tris-8-hydroxyquinoline aluminum ($Alq_3$), etc. These layers may be formed by vacuum evaporation method.

If the intermediate layer includes the high molecular weight material, the intermediate layer may have the structure including a hole transport layer (HTL) and a light emitting layer (EML). In this case, the hole transport layer may include PEDOT and the emission layer may include a polymer material such as poly-phenylenevinylene (PPV) and polyfluorene. This intermediate layer may be formed by screen printing, inkjet printing, laser induced thermal imaging (LITI), or the like.

The intermediate layer is not limited thereto, and may have various structures.

The cathode electrode 330 is disposed above the active area AA, and may be disposed to cover the active area AA as shown in FIG. 3. That is, the cathode electrode 330 may be formed integrally with the plurality of organic light emitting elements 300 to correspond to the plurality of anode electrodes 310. The cathode electrode 330 may be the (half-) transparent electrode or the reflective electrode.

When the cathode electrode 330 is the (half-) transparent electrode, the cathode electrode 330 includes a layer made of a metal having a small work function, such as Li, Ca, LiF/Ca, LiF/Al, Al, Ag, Mg, and a compound thereof, and a (half-) transparent conductive layer made of material, such as ITO, IZO, ZnO, or $In_2O_3$. When the cathode electrode 330 is a reflective electrode, the cathode electrode 330 may include a layer made of Li, Ca, LiF/Ca, LiF/Al, Al, Ag, Mg, and compound thereof. The configuration and material of the cathode electrode 330 are not limited thereto, and various modifications may be made.

In the organic light emitting display device, a preset electric signal should be supplied to the cathode electrode 330 to display an image. Thus, the low potential voltage line 101 is disposed in inactive area IA to supply the preset electric signal to the cathode electrode 330. In this embodiment, this electrode 330 is referred as the cathode electrode, but this electrode 330 can be referred as the cathode, a negative electrode, a counter electrode, an upper electrode, a second electrode.

Referring to FIG. 3, an encapsulation layer 500 may be disposed over the cathode electrode 330. The encapsulation layer 500 may protect the organic light emitting element 300 or the organic light emitting layer 320. The encapsulation layer 500 may include a first inorganic insulating layer 510, an organic insulating layer 520, and a second inorganic insulating layer 530. The organic emission layer 320 may easily react with external moisture or oxygen to cause black spots or pixel contraction. To prevent this, the encapsulation layer 500 may be disposed over the entire surface of the active area AA and the inactive area IA of the display panel 100.

Figure 4:
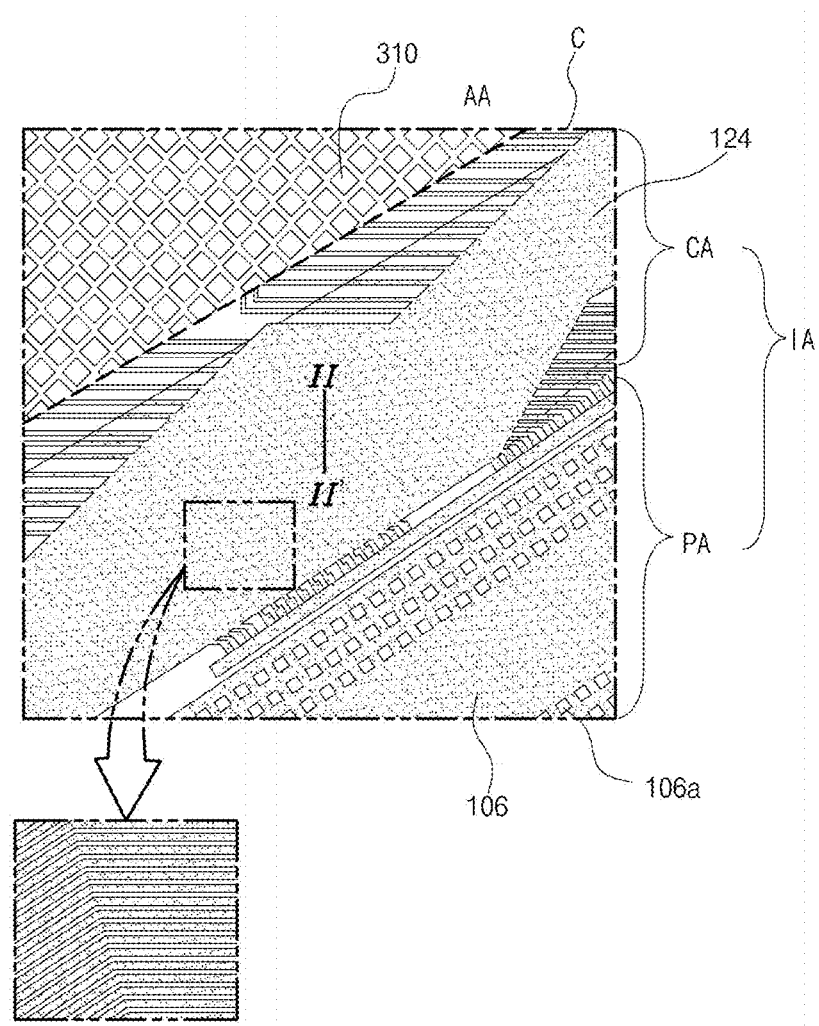
FIG. 4 is an enlarged plan view of area C of FIG. 2.

FIG. 4 is a view of an experimental example in which the area C of FIG. 2 is enlarged.

A plurality of organic light emitting elements 300 may be disposed in the active area AA and the peripheral electrode 106 covering the components may be disposed in the outside of the active area AA. The inactive area IA may include the peripheral area PA and the peripheral electrode 106 may be disposed in the peripheral area PA. A plurality of lines connecting the gate driver or the multiplexer to the organic light emitting element 300 may be disposed in the portion between the active area AA and the peripheral electrode 106.

The portion between the active area AA and the peripheral area PA may be referred to as a connection area CA.

Referring to FIG. 4, a connection line 124 may be disposed in a connection area CA between the active area AA and the peripheral electrode 106. Comparing the adjacent peripheral electrode 106 or the anode electrode 310 disposed in the active area AA, the connection line 124 may be composed of a plurality of lines having very complex structure. A plurality of the organic light emitting elements 300 each having the anode 310 are disposed in the active area AA and the peripheral electrode 106 covers the components to reflect uniformly the external light in the inactive area IA.

The anode electrode 310 and the peripheral electrode 106 may be formed of the same material. The peripheral electrode 106 may connect the cathode electrode 330 of the organic light emitting element 300 to the low potential voltage line 101 to ground the cathode electrode 330. The peripheral electrode is disposed in the inactive area IA to be connected to the end portion of the cathode electrode 330 and to be connected to the low potential voltage line 101.

Figure 5:
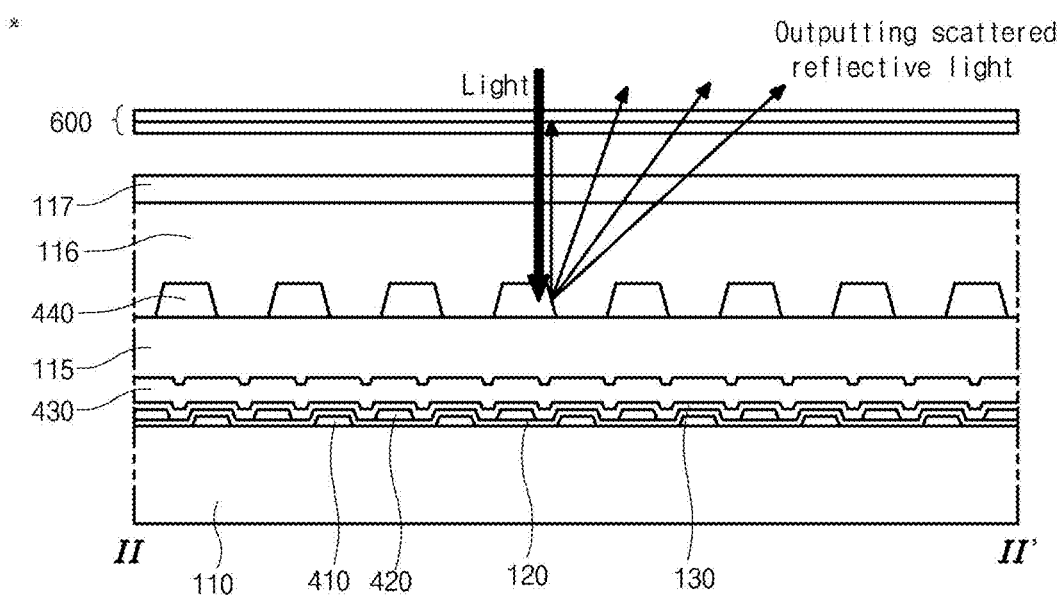
FIG. 5 is a cross sectional view along cutting line II-IF of FIG. 4.

FIG. 5 is a cross sectional view along the cutting line II-IF of FIG. 4.

Referring to FIG. 5, a first connection line 410 and a second connection line 420 may be disposed between the first gate insulating layer 120 and the interlayer 130 over the substrate 110. A third connection line 430 and a fourth connection line 440 may be disposed over the interlayer 130 with the first planarization layer 115 therebetween. A second planarization layer 116 and the bank layer 117 may be disposed over the fourth connection line 440 and a polarizing film 600 may be disposed on the uppermost layer.

The first connection line 410 and the second connection line 420 may be formed of the same material as the gate electrode 121. The third connection line 430 and the fourth connection line 440 may be formed of the same material as the source/drain electrode 123.

Referring to FIG. 5, a plurality of lines are disposed in the connection area CA to connect electrically the components in the inactive area IA and the active area AA to organic light emitting element 300. The connection area CA may be formed in tangled structure of a plurality of complex solid lines, not formed in uniform structure by a plurality of lines. Due to the structure of the connection area CA, the light incident from the outside may be scattered by complex line in the connection area CA.

For example, the external light incident through the polarizing film 600 disposed on the uppermost layer may be scattered by the fourth connection line 440 and/or the third connection line 430. Further, the light incident to the layer adjacent to the second connection line 420 and/or the first connection line 410 may be scattered at various angles and spread uniformly to the connection area CA. The scattered light may propagate toward the side portion of the first to fourth connection line 410 to 440 or the polarizing film 600, and then may be emitted to the outside through the polarizing film 600. The area where the irregular scattering light and the scattered reflected light is output appears brighter to the user's eye than the surrounding area.

Figure 6:
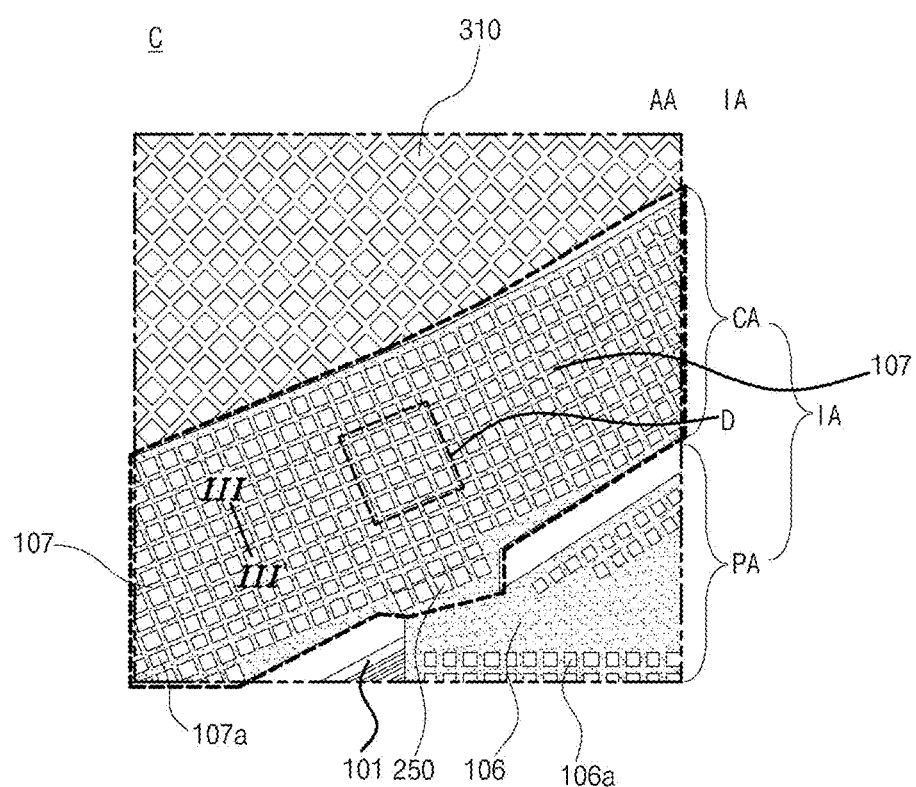
FIG. 6 is an enlarged plan view of area C of FIG. 2, and is a plan view of a comparative example.

FIG. 6 is an enlarged plan view of area C of FIG. 2 and is adapted to the invention.

Referring to FIG. 6, a plurality of anode electrodes 310 are disposed in the active area AA and the peripheral electrode 106 is disposed in the inactive area IA. The inactive area IA may include the peripheral area PA and the peripheral electrode 106 may be disposed in the peripheral area PA. The connection area CA may be disposed between the peripheral area PA and the active area AA. In this embodiment, the first reflective electrode 107 may be disposed in the connection area CA.

Although not shown in FIG. 6, the first connection electrode 410, the second connection electrode 420, the third connection electrode 430, and the fourth connection electrode 440 shown in FIG. 5 are disposed in the connection area CA. The first reflective electrode 107 may be disposed over the fourth connection electrode 440. The first reflective electrode 107 may be made of the same material as the anode electrode 310 in the active area AA or the peripheral electrode 106 in the inactive area IA. First holes 106a may be disposed in the peripheral electrode 106 disposed in the inactive area IA.

The first holes 106a of the peripheral electrode 106 may sever as a hole for discharging hydrogen $H_2$ which is generated during heating for curing the planarization layer 116 in the process of depositing and forming the planarization layer 116 disposed under the outer electrode 106. The first holes 106a may be disposed over the outer electrode 106 to have a constant spacing and a constant shape.

Since the peripheral electrode 106 and the first holes 106a are regularly arranged, the light incident from the outside may be reflected in the uniform direction. The first reflective electrode 107 disposed in the connection area CA may also have a second hole 107a similar to the first holes 106a of the peripheral electrode 106. The second holes 107a of the first reflective electrode 107 also serves as a hole for discharging hydrogen $H_2$ that may occur during the formation of the planarization layer 116 disposed under the first reflective electrode 107.

Further, since the first reflective electrode 107 has a pattern similar to that of the anode electrode 310 disposed in the active area AA and the peripheral electrode 106 of the inactive area IA, the reflection of external light is also similar thereto. The peripheral electrode 106 and the first reflective electrode 107 may be connected to each other through the first connection unit 250. The peripheral electrode 106 and the first reflective electrode 107 may be connected in the portion between the connection area CA and the peripheral area PA.

Since the peripheral electrode 106 and the first reflective electrode 107 are connected through the first connection unit 250, these electrodes may have same effect as one electrode. Therefore, the cathode electrode 330 of the organic light emitting element 300 may be connected to the first reflective electrode 107 closer to the active area AA than the peripheral electrode 106.

Figure 7:
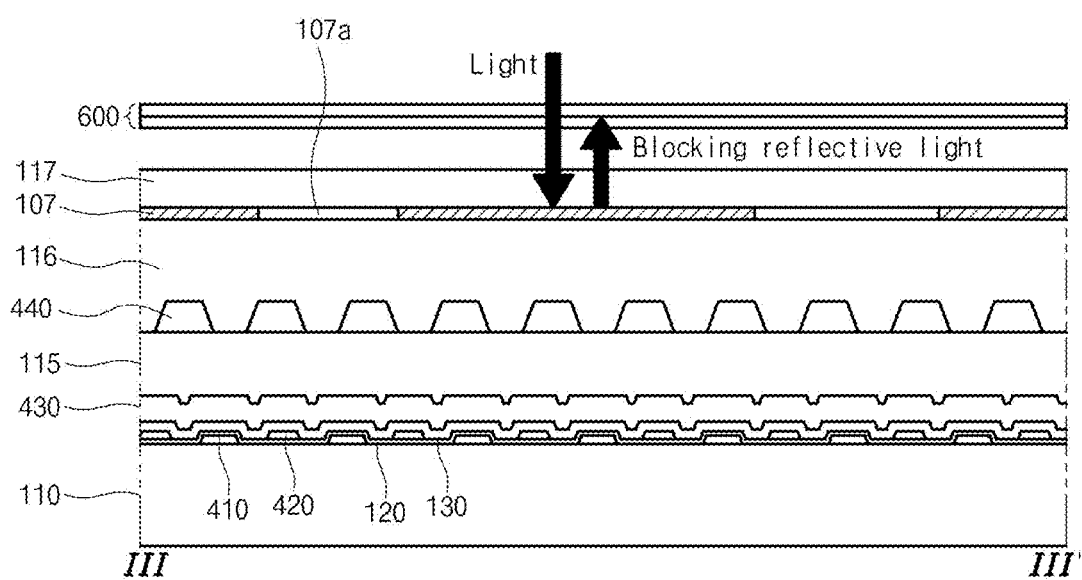
FIG. 7 is a cross sectional view along cutting line of FIG. 6.

FIG. 7 is a cross sectional view along the cutting line of FIG. 6.

Referring to FIG. 7, the first connection line 410 and the second connection line 420 may be disposed between the first gate insulating layer 120 and the interlayer over the substrate 110. the third connection line 430 and the fourth connection line 440 may be disposed over the interlayer 130 with the first planarization layer 115 therebetween. The second planarization layer 116, the first reflective electrode 107, and the bank layer 117 may be disposed over the fourth connection line 440, and a polarizing film 600 may be disposed at the uppermost layer.

The first connection line 410 and the second connection line 420 may be made of the same material as the gate electrode 121. The third connection line 430 and the fourth connection line 440 may be made of the same material as the source/drain electrode 123. The first reflective electrode 107 may be made of the same material as the anode electrode 310 or the peripheral electrode 106. Further, the second holes 107a may be formed in the first reflective electrode 107.

Referring to FIG. 7, it can be confirmed that the light incident from the outside passes through the polarizing film 600 and is primarily reflected by the first reflective electrode 107. Like the experimental embodiment of FIG. 5, in the embodiment of FIG. 7, all incident light scattered by the fourth connection line 440 and/or the third connection line 430 is reflected toward the polarizing film 600 without the scattered reflection. Thus, the light is not leakage when the user observes the light at the outside. In the liquid crystal display device, the polarizing film polarizes the incident light and outputs the polarized light by the light wave length filtering function thereof. In the organic light emitting display device, however, the polarizing film blocks the light reflected from the display panel to output only the light emitted by the organic light emitting element 300.

Due to this function of the polarizing film 600, the light reflected from the first reflective electrode 107 in the connection area CA may be totally blocked by the polarizing film 600. Similar to the active area AA or the inactive area IA in which the peripheral electrode 106 is disposed, the external incident light is controlled so that light leakage does not occur in the user's eye.

Figure 8:
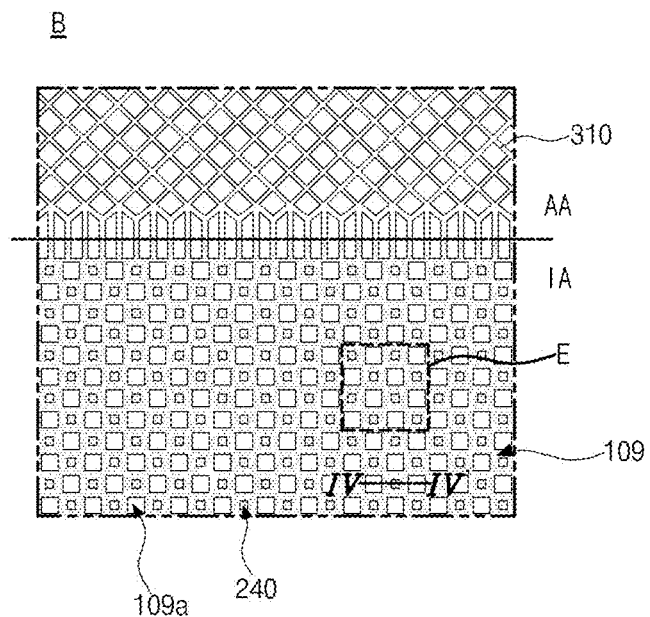
FIG. 8 is an enlarged plan view of area B of FIG. 2 and is a plan view according to the embodiment of the invention.

FIG. 8 is an enlarged plan view of area B of FIG. 2.

Referring to FIG. 8, a plurality of anode electrodes 310 of the organic light emitting element 300 may be disposed in the active area AA. The second reflective electrode 109 is widely disposed in the inactive region IA to supply the high potential voltage VDD or the data signal. The second reflective electrode 109 may be made of the same material as the source/drain electrode 123.

The second reflective electrode 109 may have third holes 109a. The third holes 109a allow the second reflective electrode 109 to have a pattern similar to that of the first reflective electrode 107, the anode electrode 310, and the peripheral electrode 106, so that the reflection of the incident light may be performed similar to that of the first reflective electrode 107, the anode electrode 310, and the peripheral electrode 106. For example, the incident external light may be reflected by the second reflective electrode 109 and blocked by the polarizing film 600. The second reflective electrode 109 may have a second connection unit 240 together with the third holes 109a.

The second connection unit 240 may connect electrically the second reflective electrode 109 and the third connection line 430. By the second connection unit 240, the electrical resistance applied to the third connection line 430 and the second reflective electrode 109 may be reduced so that the organic light emitting element 300 disposed in the active area AA may be driven more efficiently.

Figure 9:
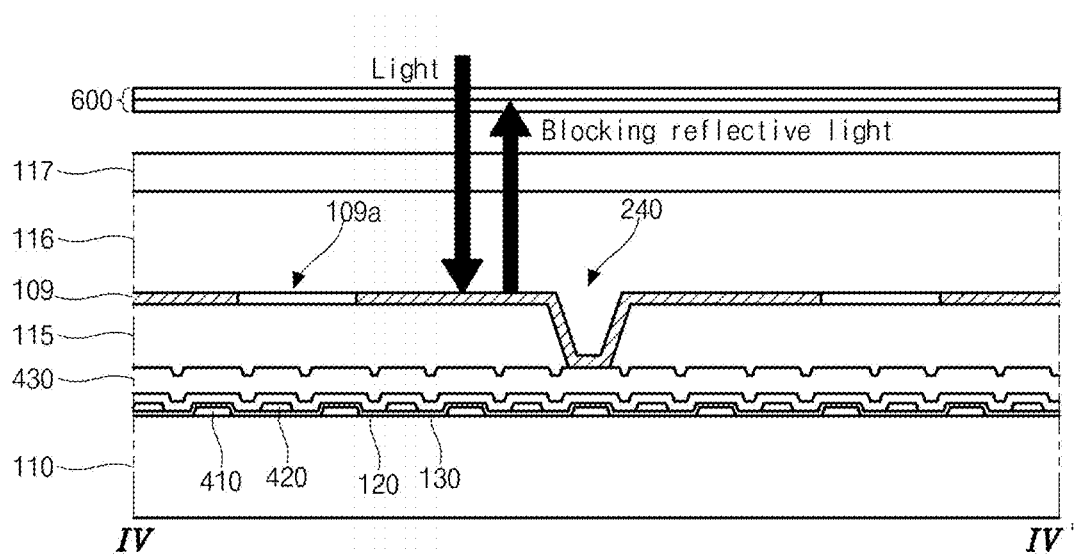
FIG. 9 is a cross sectional view along cutting line Iv-Iv' of FIG. 8.

FIG. 9 is a cross sectional view of the cutting line IV-IV' of FIG. 8.

Referring to FIG. 9, the first connection line 410 and the second connection line 420 may be disposed between the first gate insulating layer 120 and the interlayer 130 over the substrate 110. The third connection line 430 and the second reflective electrode 109 may be disposed over the interlayer 130 with the first planarization layer 115 therebetween.

The second planarization layer 116 and the bank layer 117 may be disposed on the second reflective electrode 109 and the polarizing film 600 may be disposed at the uppermost layer. The first connection line 410 and the second connection line 420 may be made of the same material as the gate electrode 121. The third connection line 430 and the second reflective electrode 109 may be formed of the same material as the source/drain electrode 123.

Third holes 109a and a second connection unit 240 may be disposed in the second reflective electrode 109. The second connection unit 240 may be disposed between a plurality of third holes 109a formed in the second reflective electrode 109. In the second connection unit 240, a part of the second reflective electrode 109 is connected to the third connection line 430 through the contact hole formed in the first planarization layer 115. The second connection unit 240 may electrically connect the third connection line 430 and the second reflective electrode 109 to form a single line or a single electrode.

The electrical resistance of the third connection line 430 and the second reflective electrode 109 may be decreased because of the second connection unit 240. The decrease of the electrical resistance causes the effect same as the increase in the thickness of the line so that the efficiency of the organic light emitting device 300 may be improved.

Referring to FIG. 9, it can be confirmed that the light incident from the outside passes through the polarizing film 600 and is primarily reflected by the second reflective electrode 109. Like the experimental embodiment of FIG. 5, in the embodiment of FIG. 9, all incident light scattered by the fourth connection line 440 and/or the third connection line 430 is reflected toward the polarizing film 600 without the scattered reflection. Thus, the light is not leakage when the user observes the light at the outside. In the liquid crystal display device, the polarizing film polarizes the incident light and outputs the polarized light by the light wave length filtering function thereof. In the organic light emitting display device, however, the polarizing film blocks the light reflected from the display panel to output only the light emitted by the organic light emitting element 300.

Due to this function of the polarizing film 600, the light reflected from the second reflective electrode 109 in the connection area CA may be totally blocked by the polarizing film 600. Similar to the active area AA or the inactive area IA in which the peripheral electrode 106 is disposed, the external incident light is controlled so that light leakage does not occur in the user's eye.

Figure 10:
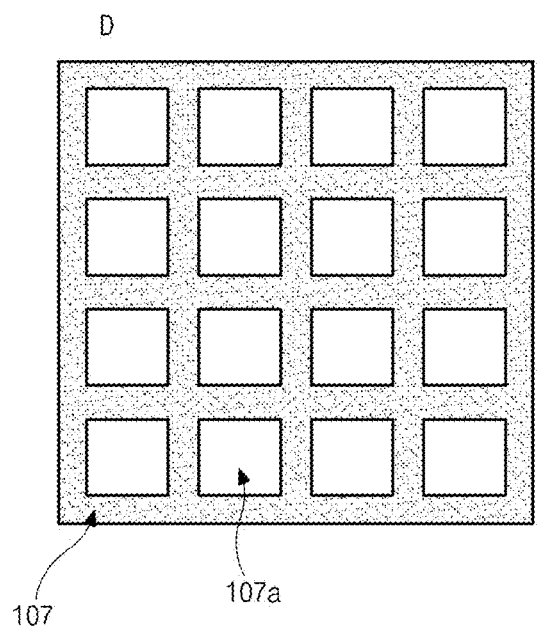
FIG. 10 is an enlarged plan view of area D of FIG. 6.

FIG. 10 is an enlarged plan view of area D of FIG. 6.

Referring to FIG. 10, a plurality of square-shaped second holes 107a may be disposed in the first reflective electrode 107. The second holes 107a may have a shape similar to the first holes 106a of the peripheral electrode 106, but is not limited thereto and may have a different shape.

Figure 11:
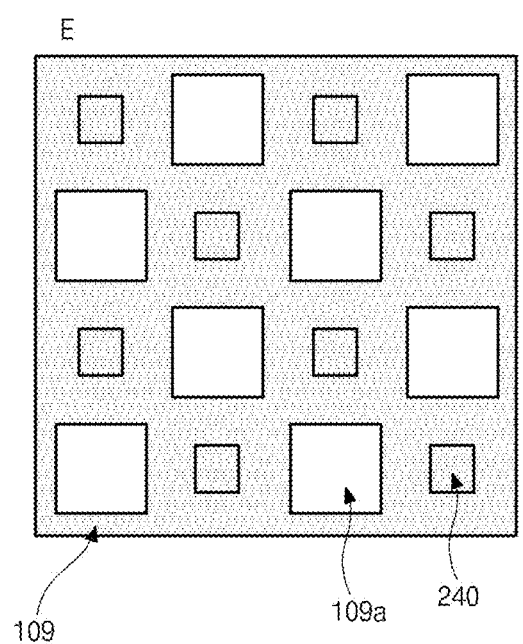
FIG. 11 is an enlarged view of area E of FIG. 8.

FIG. 11 is an enlarged view of area E of FIG. 8.

Referring to FIG. 11, a plurality of square-shaped third holes 109a may be disposed in the second reflective electrode 109. The third holes 109a may have a shape similar to the first holes 106a of the peripheral electrode 106 or the second holes 107a of the first reflective electrode 107, but is not limited thereto and may have various shapes. A second connection unit 240 may be disposed between a plurality of third holes 109a disposed in the second reflective electrode 109. The second connection unit 240 may have a rectangular shape similar to that of the third holes 109a. However, it is not necessarily limited thereto and may have various forms.

The display device according to the embodiment of the invention includes the liquid crystal display device (LCD), the field emission display device (FED), the organic light emitting display device (OLED), and the quantum dot display device.

The display device according to the embodiment of the invention includes a complete product or a final product having LCM or OLED module, that is, a notebook computer, a television, a computer monitor, an equipment display apparatus including an automotive display apparatus or other type display apparatus of the vehicle, a set electronic device apparatus or set device (set apparatus) including mobile electronic device apparatus such as a smart phone or an electronic pad etc., The display device according to the embodiment of the invention may be described as follows.

The display device according to an embodiment of the invention may comprise the substrate including an active area and the inactive area surrounding the active area, a plurality of thin film transistor disposed in the active area, each of the thin film transistor including the semiconductor layer and the first electrode, the light emitting elements disposed in the active area, each of the light emitting element including the anode electrode and the organic light emitting layer, the connection area and the peripheral area disposed in the inactive area, and the first reflective electrode disposed in the connection area.

The display device according to an embodiment of the invention may include a peripheral electrode disposed in the peripheral area, wherein the first reflective electrode and the peripheral electrode may be formed of the same material.

The display device according to an embodiment of the invention may further include the gate driver disposed at the lower portion of the peripheral electrode.

The display device according to an embodiment of the invention may further include the first connection line and the second connection line disposed at the lower portion of the first reflective electrode, wherein at least one of the first connection line and the second connection line is connected to the gate driver.

In the display device according to an embodiment of the invention, the peripheral electrode includes the first holes and the first reflective electrode includes the second holes.

The display device according to an embodiment of the invention may further include the crack stopper structure disposed outside of the connection area and the peripheral area.

In the display device according to an embodiment of the invention, the first reflective electrode and the peripheral electrode further include the first connection unit between the connection area and the peripheral area.

The display device according to an embodiment of the invention may further include the second reflective electrode disposed in the inactive area, wherein the second reflective electrode and the first electrode are formed of the same material.

In the display device according to an embodiment of the invention, the second reflective electrode includes third holes and a second connection unit.

The display device according to an embodiment of the invention may comprise the substrate including an active area and the inactive area surrounding the active area, a plurality of thin film transistor disposed in the active area, each of the thin film transistor including the source/drain electrodes, the light emitting elements disposed in the active area, each of the light emitting element including the anode electrode, the organic light emitting layer, and the cathode electrode, the connection area and the peripheral area disposed in the inactive area, and the first reflective electrode disposed in the connection area.

The display device according to an embodiment of the invention may further include the peripheral electrode disposed in the peripheral area, wherein the cathode electrode is connected to the peripheral electrode at the portion between the connection area and the peripheral area.

In the display device according to an embodiment of the invention, the first reflective electrode and the anode electrode are formed of the same material and the first reflective electrode includes second holes.

In the display device according to an embodiment of the invention, the inactive area further includes a second reflective electrode, and the second reflective electrode is formed of the same material as the source/drain electrodes.

In the display device according to an embodiment of the invention, the second reflective electrode includes third holes and a second connection unit.

In the display device according to an embodiment of the invention, the first reflective electrode and the peripheral electrode further including the first connection unit between the connection area and the peripheral area and the peripheral electrode includes first holes.

Various modifications of the specification or structures that can be easily created based on the specification should also be included in the scope of the specification. Accordingly, the scope of the rights of the specification should not be determined by the above detailed description, but should be determined by the appended claims. Features, structures, effects, and the like described in the examples of the present application are included in at least one example, and are not necessarily limited to only one example. Further, the features, structures, effects, and the like exemplified in at least one example of the present application may be combined or modified for other examples by person skilled in the art to which the present application belongs. Accordingly, contents related to such combinations and modifications should be construed as being included in the scope of the present application.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel including an active area and an inactive area surrounding the active area, the inactive area having a peripheral area;
   a plurality of thin film transistors disposed in the active area, each of the thin film transistor including a semiconductor layer and a first electrode;
   a light emitting elements disposed in the active area, each of the light emitting element including an anode electrode and an organic light emitting layer;
   a connection area between the active area and the peripheral area of the inactive area;
   a first reflective electrode disposed in the connection area and
   a polarizing film disposed above the first reflective electrode.

2. The display device of claim 1, further comprising a peripheral electrode disposed in the peripheral area, wherein the first reflective electrode and the peripheral electrode are formed of the same material.

3. The display device of claim 2, further comprising a gate driver disposed at the lower portion of the peripheral electrode.

4. The display device of claim 3, further comprising a first connection line and a second connection line disposed at the lower portion of the first reflective electrode, wherein at least one of the first connection line and the second connection line is connected to the gate driver.

5. The display device of claim 2, wherein the peripheral electrode includes first holes and the first reflective electrode includes second holes.

6. The display device of claim 5, wherein the first holes have a constant spacing and a constant shape.

7. The display device of claim 2, wherein the first reflective electrode and the peripheral electrode further including a first connection unit between the connection area and the peripheral area.

8. The display device of claim 1, further comprising a crack stopper structure disposed outside of the connection area and the peripheral area.

9. The display device of claim 1, further comprising a second reflective electrode disposed in the inactive area, wherein the second reflective electrode and the first electrode are formed of the same material.

10. The display device of claim 9, wherein the second reflective electrode includes third holes and a second connection unit.

11. A display device, comprising:
 a display panel including an active area and an inactive area surrounding the active area, the inactive area having a peripheral area;
 a plurality of thin film transistors disposed in the active area, each of the thin film transistor including source/drain electrodes;
 a light emitting elements disposed in the active area, each of the light emitting element including an anode electrode, an organic light emitting layer, and a cathode electrode;
 a connection area between the active area and the peripheral area of the inactive area;
 a first reflective electrode disposed in the connection area; and
 a polarizing film disposed above the first reflective electrode.

12. The display device of claim 11, further comprising a peripheral electrode disposed in the peripheral area, wherein the cathode electrode is connected to the peripheral electrode at the portion between the connection area and the peripheral area.

13. The display device of claim 12, wherein the first reflective electrode and the peripheral electrode further including a first connection unit between the connection area and the peripheral area and the peripheral electrode includes first holes.

14. The display device of claim 11, wherein the first reflective electrode and the anode electrode are formed of the same material and the first reflective includes second holes.

15. The display device of claim 11, wherein the inactive area further includes a second reflective electrode, and the second reflective electrode is formed of the same material as the source/drain electrodes.

16. The display device of claim 15, wherein the second reflective electrode includes third holes and a second connection unit.

* * * * *